(12) United States Patent
Ho-Cheng et al.

(10) Patent No.: US 6,194,231 B1
(45) Date of Patent: Feb. 27, 2001

(54) METHOD FOR MONITORING POLISHING PAD USED IN CHEMICAL-MECHANICAL PLANARIZATION PROCESS

(75) Inventors: Hong Ho-Cheng; Kuo-Hsing Liu, both of Hsinchu (TW)

(73) Assignee: National Tsing Hua University (TW)

( * ) Notice: Subject to any disclaimer, the term of this patent is extended or adjusted under 35 U.S.C. 154(b) by 0 days.

(21) Appl. No.: 09/259,840

(22) Filed: Mar. 1, 1999

(51) Int. Cl.$^7$ .......................... H01L 21/302; B24B 49/12
(52) U.S. Cl. .................. 438/8; 438/16; 438/692; 451/6; 216/84
(58) Field of Search ................... 438/8, 14, 16, 438/692; 451/6, 9; 216/84

(56) References Cited

U.S. PATENT DOCUMENTS

| | | |
|---|---|---|
| 5,036,015 | 7/1991 | Sandhue et al. ................... 437/8 |
| 5,222,329 | 6/1993 | Yu ................................ 51/165.77 |
| 5,240,552 | 8/1993 | Yu et al. ........................ 156/636 |
| 5,483,568 | 1/1996 | Yano et al. ......................... 378/44 |
| 5,609,718 | 3/1997 | Meikle et al. ................... 156/626.1 |
| 5,655,951 | 8/1997 | Meikle et al. ..................... 451/56 |
| 5,664,987 | * 9/1997 | Renteln ............................ 451/21 |
| 5,708,506 | * 1/1998 | Birang ............................. 356/371 |
| 5,801,066 | 9/1998 | Meikle et al. ..................... 438/14 |
| 5,835,225 | * 11/1998 | Thakur ............................ 356/381 |
| 5,951,370 | * 9/1999 | Cesna ............................. 451/21 |

* cited by examiner

Primary Examiner—Randy Gulakowski
Assistant Examiner—Jiri F. Smetana
(74) Attorney, Agent, or Firm—Laff, Whitesel & Saret, Ltd.; J. Warren Whitesel; Charles A. Laff

(57) ABSTRACT

A method for monitoring a condition of a polishing pad used in a chemical-mechanical planarization (CMP) process to polish a semiconductor wafer is disclosed. The method uses a linear multi-dimensional scanning device arranged above the polishing pad in a radial direction to monitor the changes in profile of the surface of the polishing pad, and determines the condition of the polishing pad according to the profile information. When the change in profile of the surface of the polishing pad substantially exceeds a preset value, e.g. 2 mm, it is indicated that the polishing pad should be changed.

10 Claims, 5 Drawing Sheets

METHOD FOR MONITORING POLISHING PAD USED IN CHEMICAL-MECHANICAL PLANARIZATION PROCESS

FIELD OF THE INVENTION

The present invention is related to a method for monitoring a condition of a polishing pad used in a chemical-mechanical planarization (CMP) process to polish a semiconductor wafer so as to, for example, determine whether the polishing pad is suitable for polishing or should be changed.

BACKGROUND OF THE INVENTION

A chemical-mechanical planarization (CMP) procedure is widely used in a semiconductor manufacturing process for planarizing a wafer. The apparatus and the operating cycle for a CMP process is briefly described with reference to FIG. 1 which is a schematic cross-sectional view of a conventional CMP apparatus. In the CMP apparatus, a platen 6 is rotatably mounted, and a polishing pad 4 is secured on and rotated with the platen 6. The back surface of a wafer 8 to be polished is held by a carrier 7 and parallelly placed on the platen 6 so that the front surface of the wafer 8 is in contact with the polishing pad 4. The carrier 7 also rotates during the CMP process in a direction the same as the platen 6. During the CMP process, polishing slurry 9 is continuously provided onto the polishing pad 4 for facilitating to polish the wafer 8. The slurry 9 is supplied through a pipeline 5 arranged above the platen 6. After a CMP cycle in which a wafer or several wafers is or are simultaneously planarized is completed, the polishing pad 4 is subjected to a conditioning cycle to restore its proper function. Therefore, in brief, the purpose for polishing a wafer can be achieved by gradually removing bumps on the surface of the wafer via a chemical reaction conducted by the polishing slurry and a mechanical force applied to the wafer through the operations of the above devices.

The control of the CMP process for precisely planarizing a semiconductor wafer, however, is relatively complicated because of a great number of variations in the process. The condition of the polishing pad is one of the variations which are considered uneasy to be controlled. In other words, with the increasing abrasion in the CMP cycles and the conditioning cycles, the condition of the polishing pad is gradually deteriorated, and the pad should be changed when the pad surface is lowered to an unacceptable value. Therefore, it is important to monitor the condition of the polishing pad frequently.

Monitoring methods used in a CMP process is various. For example, Sandhu et al, U.S. Pat. No. 5,036,015, monitors a planar endpoint by measuring the current change in the driving motor of the carrier. Yu et al, U.S. Pat. Nos. 5,222,329 and 5,240,552, monitor an endpoint and thickness of films formed on a wafer by analyzing acoustical waves and reflected acoustical waves from the wafer. Yano et al, U.S. Pat. No. 5,483,568, monitors a polishing rate by detecting the intensity of the X-ray fluorescence resulting from an X-ray beam illuminating the polishing pad.

Meikle et al., U.S. Pat. Nos. 5,609,718, 5,655,951 and 5,801,066, disclose a method and an apparatus for measuring a change in the thickness of the polishing pad by using a laser beam detector. This method for monitoring the thickness change of the polishing pad is conducted by measuring the thickness change at a plurality of specified points after the pad is conditioned. In other words, the thickness of discontinuous points on the surface of the polishing pad is measured. As known to those skilled in the art, however, thickness measurement may be interfered by the polishing slurry so that there may be some irreliable data present. For such a sampling way, it is difficult to determine which data points are not reliable and should be ignored. On the other hand, the thickness measurement of the above method is conducted after the pad is conditioned and cannot be performed during the CMP cycle so that a thickness-measuring step is required in addition to the CMP cycle and the conditioning cycle, and the purpose for on-line monitoring of the polishing pad cannot be achieved.

SUMMARY OF THE INVENTION

An object of the present invention is to provide a method for monitoring a condition of a polishing pad used in a CMP process, by which the time to change a polishing pad can be easily determined.

Another object of the present invention is to provide a method for monitoring a condition of a polishing pad used in a CMP process, by which an on-line monitoring of the condition of the polishing pad can be performed.

A further object of the present invention is to provide a method for monitoring a condition of a polishing pad used in a CMP process, in which a profile information rather than thickness data of separated points is used to determine the condition of the polishing pad so as to lower the probability of errors.

According to the present invention, a method for monitoring a polishing pad used for polishing a semiconductor wafer in a CMP cycle, includes steps of:

a) installing a linear multi-dimensional scanning device above the polishing pad in a radial direction without overlapping the semiconductor wafer, the linear multi-dimensional scanning device including a first section for scanning a first portion of the polishing pad which is in intermittent contact with and polishes the semiconductor wafer during the CMP cycle, and a second section for scanning a second portion of the polishing pad which is never in contact with the semiconductor wafer during the CMP cycle;

b) reading and comparing scanning data in both of the first and the second portions to realize a surface profile information of the polishing pad; and c) determining a condition of the polishing pad according to the profile information of the polishing pad.

In the step a), while the pad surface in the first portion will be lowered after a period of polishing time, the pad surface in the second portion is not lowered.

The linear multi-dimensional scanning device can be a scanning head of a commercial reverse engineering 3D laser scanning system. If a relatively long scanning head is used, one scanning head is enough for serving as both of the first and the second sections. Alternatively, if the selected scanning head is relatively short, two scanning heads may be needed to serve as the first section and the second section, respectively.

Preferably, the step b) is conducted during the CMP cycle. However, the step b) can also be conducted before or after the CMP cycle, or after a conditioning cycle.

In accordance with an aspect of the present invention, the scanning data are relative levels along a radius on a surface of the polishing pad in contact with the semiconductor wafer. Preferably, a step of ignoring any data point of the relative levels which are beyond a preset range is performed before the step c) in order to lower the probability of errors. Meanwhile, according to another aspect of the present invention, the condition of the polishing pad is determined to be deteriorated when a maximal difference among the relative levels irrespective of the ignored data point exceeds a preset value.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
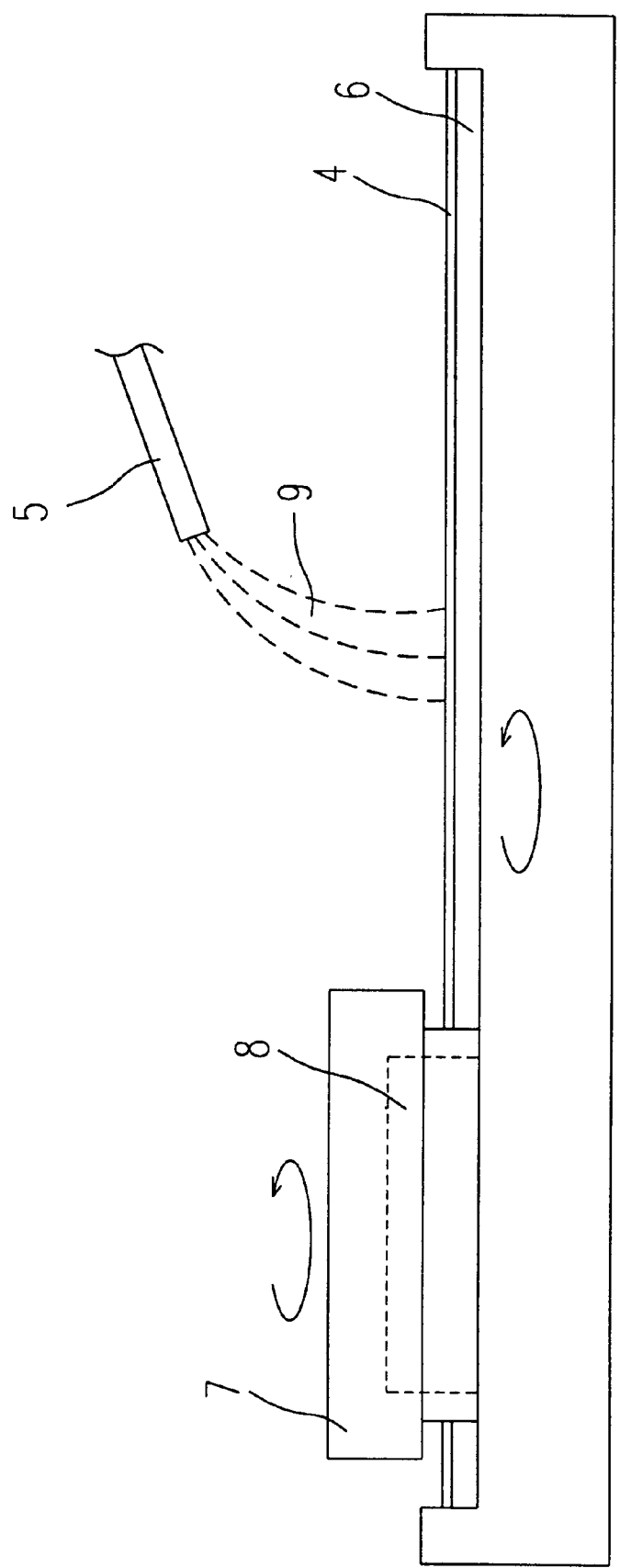
FIG. 1 is a schematic cross-sectional view of a conventional CMP apparatus.
Figure 2:
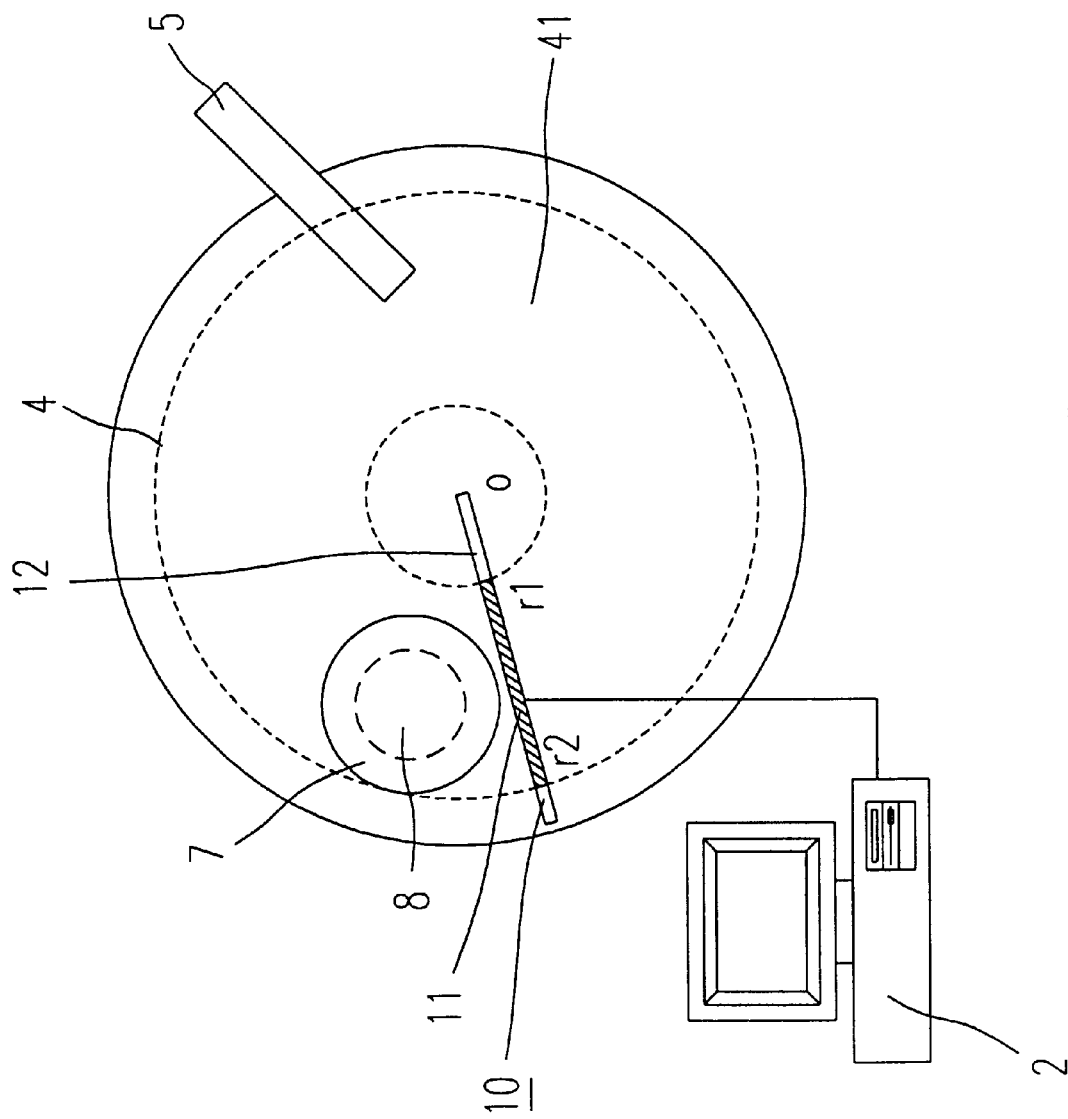
FIG. 2 is a schematic top plane view of a first preferred embodiment of a CMP apparatus used in the method according to the present invention.

Please refer to FIG. 2 which is a schematic top plane view of a first preferred embodiment of a CMP apparatus used in the method according to the present invention. The apparatus is similar to the apparatus shown in FIG. 1 except that a linear multi-dimensional scanning device 10 electrically connected to a computer 2 is provided for monitoring the change in profile of the polishing pad 4. The linear multi-dimensional scanning device 10 is arranged above the polishing pad 4 in a radial or near radial direction without overlapping the semiconductor wafer 8 held by the carrier 7.

When a CMP process is performed, the carrier 7 and the polishing pad 4 rotating with the platen 6 (not shown here, please see FIG. 1) rotate in a specific direction, e.g. clockwise or counterclockwise, and slurry is supplied from the pipeline 5 to polish the surface of the wafer 8. Consequently, an annular region 41 in rotating contact with the wafer 8 will be consumed and become gradually recessed. The linear multi-dimensional scanning device 10 measures the surface profiles of the polishing pad 4 at various times. Typically, the profile information is measured whenever the polishing pad 4 is rotated by one cycle or integral cycles so that the profile information at the same position of the polishing pad 4 is measured. In practice, however, the position at which the profile is measured is not very critical because the error is extremely small. The linear multi-dimensional scanning device 10 includes a section 11 covering at least a portion of the annular region 41 and a section 12 covering at least a portion of the polishing pad 4 other than the annular region 41 for calibration. From the section 11 of the linear multi-dimensional scanning device 10, relative levels of the portion of the polishing pad 4 covered by the section 11 is measured. From the section 12 of the linear multi-dimensional scanning device 10, relative levels of the portion of the polishing pad 4 covered by the section 12 is measured. The measured relative levels are then transmitted into and analyzed by the computer 2 to obtain the profile information. In this embodiment, a single device having a length sufficient for including the first and the second sections therein serves as the multi-dimensional scanning device 10. An example of the multi-dimensional scanning device 10 is a scanning head of a commercial reverse engineering 3D laser scanning system. For instance, a scanning head of Model CT-L1, CT-L2, CT-L3 or CT-L4 manufactured by Chi-Tai Tech., Taiwan, can be used.

Figure 3:
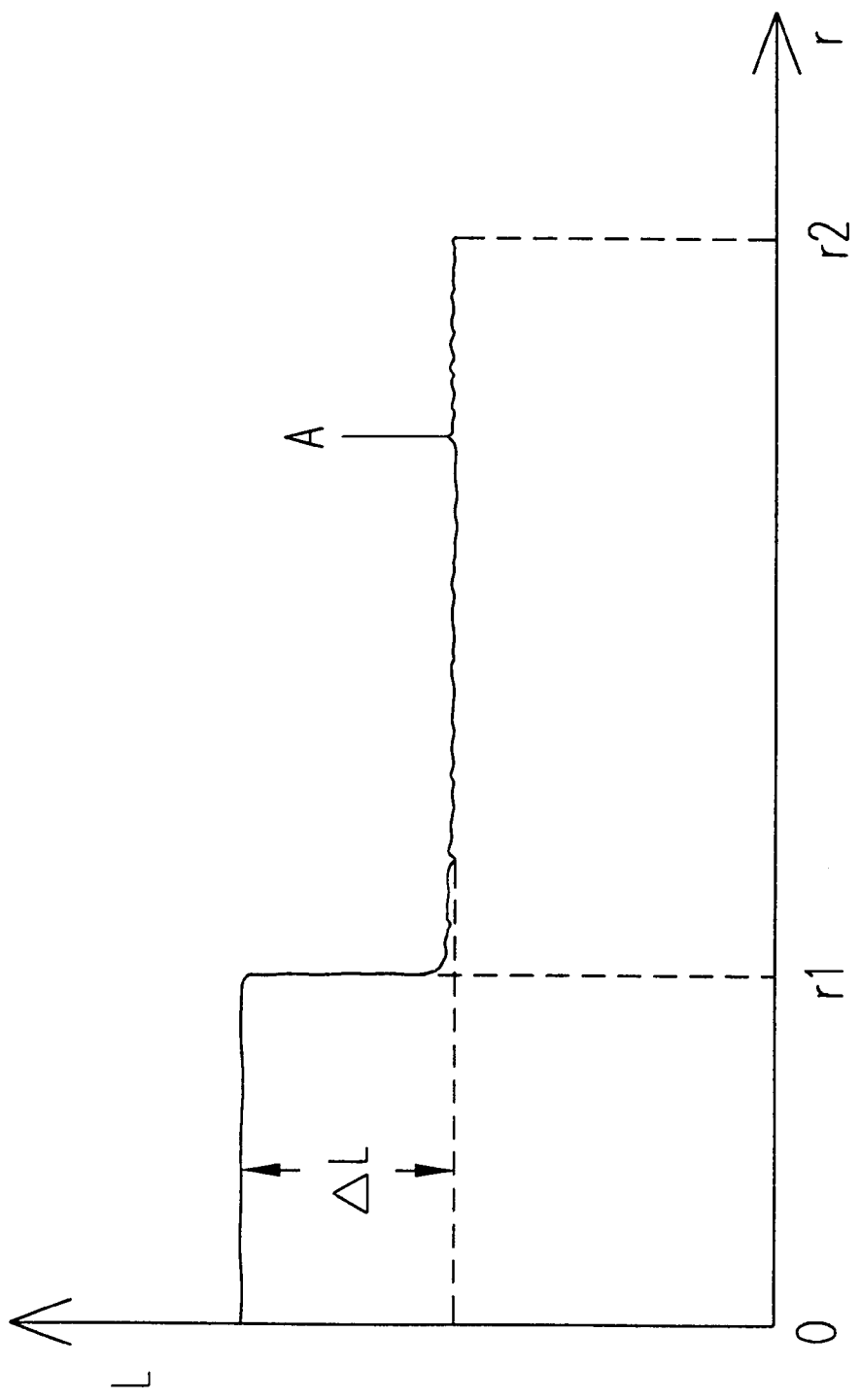
FIG. 3 is a level vs. radial coordinate plot schematically showing the profile information measured in a certain measuring cycle.

An illustrative example of the profile information is shown in FIG. 3 for further understanding. FIG. 3 is a level (L) vs. radial coordinate (r) plot schematically showing the profile information measured by the multi-dimensional scanning device 10 in a certain measuring cycle. A portion of the curve located between the abscissa coordinate 0 and r1 indicates the result measured by the section 12 of the multi-dimensional scanning device 10, and the other portion of the curve located between the abscissa coordinate r1 and r2 indicates the result measured by the section 11 of the multi-dimensional scanning device 10. As known to those skilled in the art, polishing slurry may interfere the measurement so as to result in some irreliable level data, and such irreliable data should be excluded from the profile information. According to the example shown in FIG. 3, it is apparent that the point A is beyond a reasonable range of errors for a profile curve and should be ignored. The exclusion of data points can be executed by the computer 2 by presetting a threshold value. After excluding the irreliable data from the profile information, a maximal difference $\Delta L$ among the level data is calculated. If the maximal difference $\Delta L$ is less than a preset value, e.g. 2 mm, it is indicated that the polishing pad is still in a normal working condition. On the contrary, when the maximal difference $\Delta L$ exceeds the preset value, e.g. 2 mm, it is indicated that the polishing pad should be changed. As for the determination of the preset value of the maximal difference $\Delta L$, it can be adjusted according to the properties of the polishing pad and the requirements on the CMP process. It is understood that according to the present method and by using such an apparatus, an on-line monitor can be performed without interrupting the CMP process.

Figure 4:
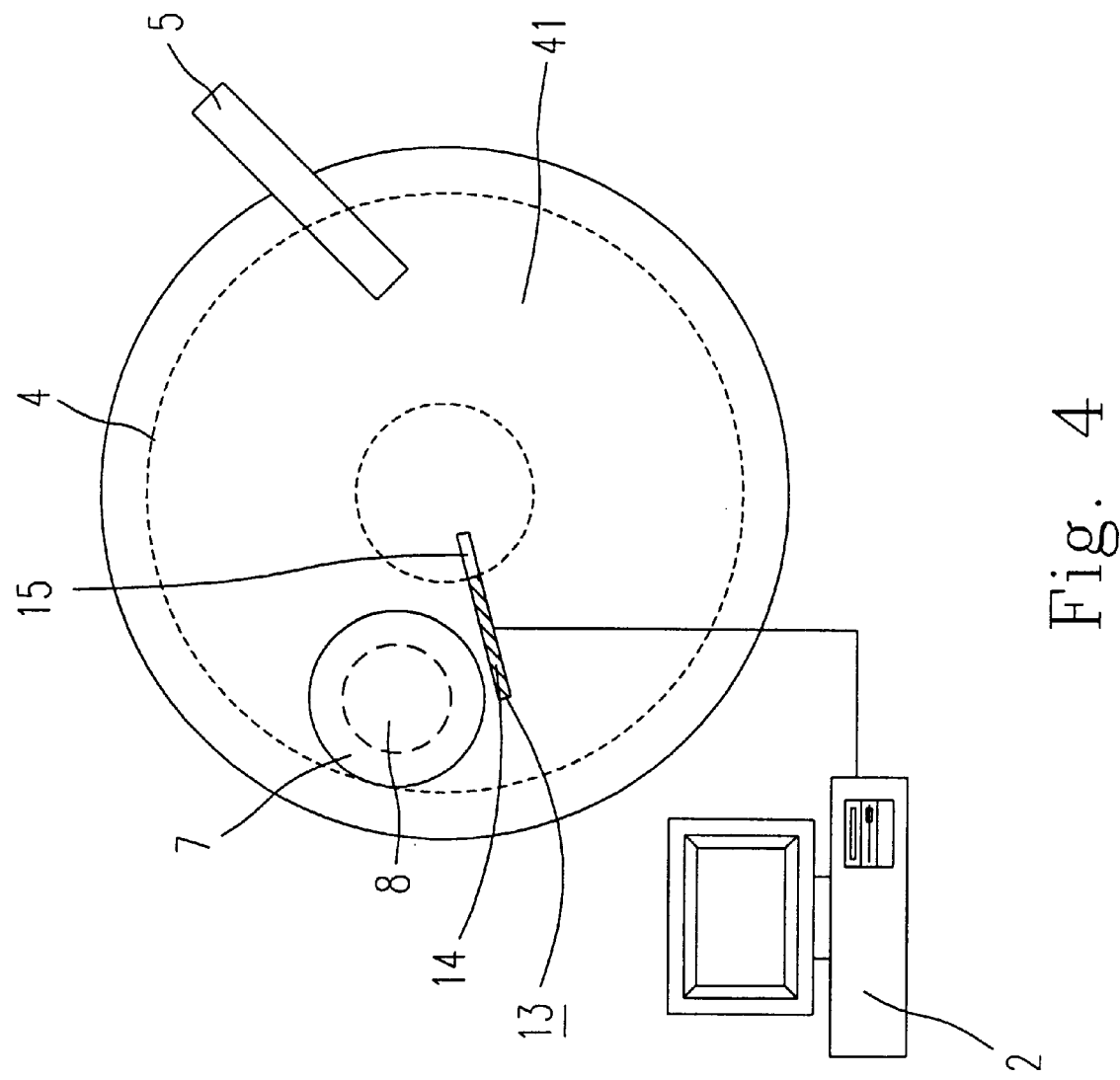
FIG. 4 is a schematic top plane view of a second preferred embodiment of a CMP apparatus used in the method according to the present invention.

Please refer to FIG. 4 which is a schematic top plane view of a second preferred embodiment of a CMP apparatus used in the method according to the present invention. This embodiment is similar to the embodiment shown in FIG. 2 except that a linear multi-dimensional scanning device 13 shorter than the multi-dimensional scanning device 10 is used and the monitoring operation is performed whenever a CMP cycle is completed. The relatively short scanning device 13 is arranged above the polishing pad 4 at the interface between the annular region 41 and a region surrounded by the region 41, as shown in FIG. 4. Although short, the linear multi-dimensional scanning device 13 still includes a section 14 covering a portion of the annular region 41 and a section 15 covering a portion of the polishing pad 4 other than the annular region 41 for calibration. The linear multi-dimensional scanning device 13 can be any conventional scanning head as mentioned in the first embodiment, and the operational is similar to that shown in FIG. 3.

Figure 5:
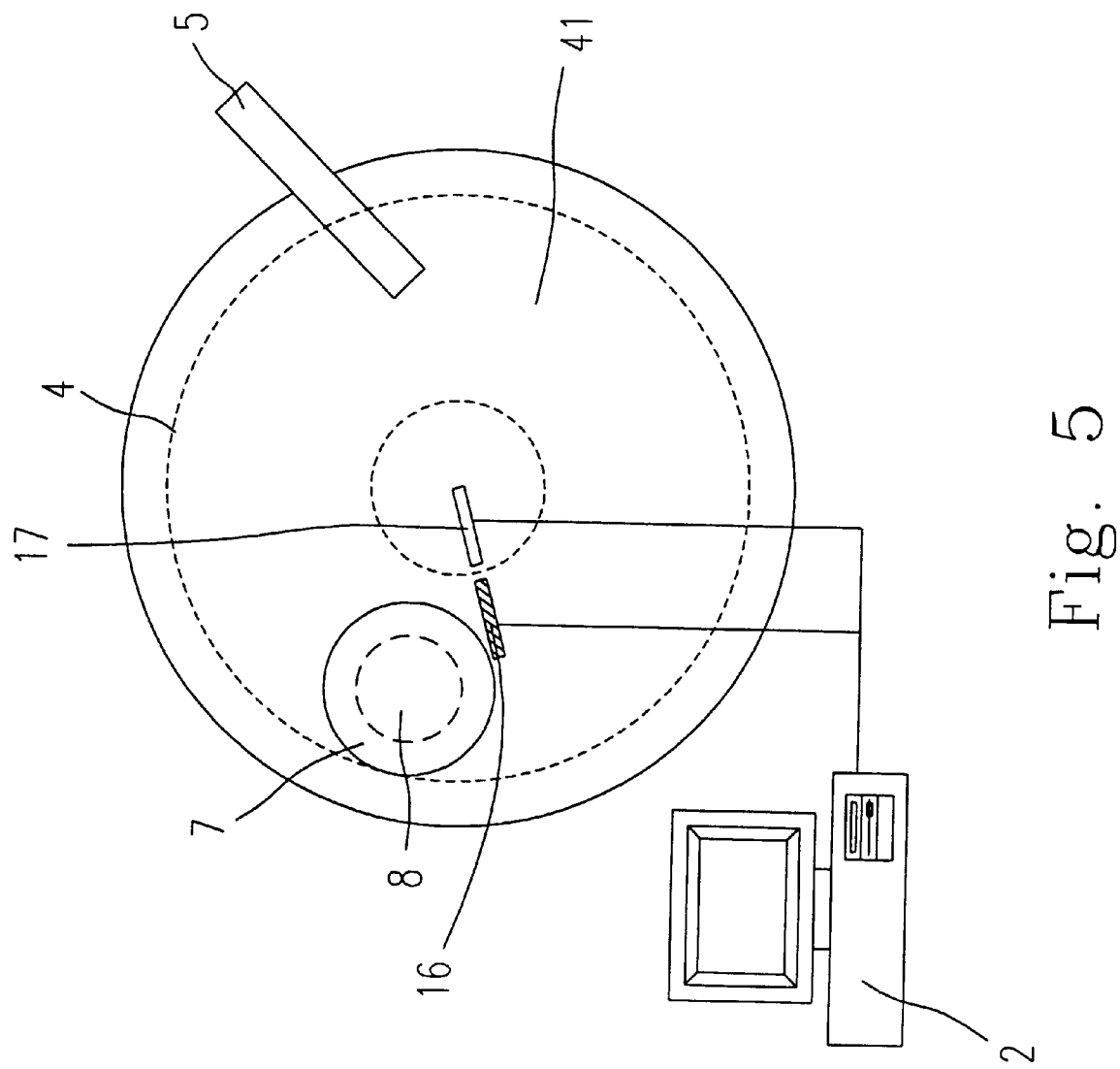
FIG. 5 is a schematic top plane view of a third preferred embodiment of a CMP apparatus used in the method according to the present invention.

Please refer to FIG. 5 which is a schematic top plane view of a third preferred embodiment of a CMP apparatus used in the method according to the present invention. This embodiment is similar to the embodiment shown in FIG. 2 except that two relatively short conventional scanning heads 16 and 17 as mentioned above are used as the first section and the second section, respectively, and the monitoring operation is performed after a conditioning cycle to remove the material resulting from the polished wafer is completed and before a new CMP cycle is started. The scanning heads 16 and 17 are arranged above the polishing pad 4 along the same radius, one within the annular region 41 and one out of the region 41, as shown in FIG. 5. Although the two sections are not continuous, the characteristic profile can still be observed in a way similar to that shown in FIG. 3.

It should be noted that the arrangement of the linear multi-dimensional scanning device 10, 13 or 16 and 17 should not overlap the wafer to be polished in order to clearly monitor the polishing pad. Therefore, if more than one wafers are placed on the polishing pad to be planarized in a single CMP cycle, the linear multi-dimensional scanning device should be arranged between two wafers.

Furthermore, if more profile data are required, three or more scanning heads can be included in the linear multi-dimensional scanning device and/or two or more linear multi-dimensional scanning devices can be arranged in various radial directions.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for monitoring a polishing pad used for polishing a semiconductor wafer in a CMP cycle, comprising steps of:

a) installing a linear multi-dimensional scanning device above said polishing pad in a substantially radial direction without overlapping said semiconductor wafer, said linear multi-dimensional scanning device including a first section for scanning a first portion of said polishing pad which is in intermittent contact with and polishes said semiconductor wafer during said CMP cycle, and a second section for scanning a second portion of said polishing pad which is never in contact with said semiconductor wafer during said CMP cycle;

b) reading and comparing scanning data in both of said first and said second portions to realize a profile information of said polishing pad; and c) determining a condition of said polishing pad according to said profile information of said polishing pad.

2. The method according to claim 1 wherein said linear multi-dimensional scanning device is a scanning head of a commercial reverse engineering 3D laser scanning system.

3. The method according to claim 2 wherein said linear multi-dimensional scanning device is consisted of one said scanning head partly serving as said first section and partly serving as said second section.

4. The method according to claim 2 wherein said linear multi-dimensional scanning device is consisted of two said scanning heads serving as said first section and said second section, respectively.

5. The method according to claim 1 wherein said step b) is conducted before said CMP cycle.

6. The method according to claim 1 wherein said step b) is conducted during said CMP cycle.

7. The method according to claim 1 wherein said step b) is conducted after said CMP cycle.

8. The method according to claim 1 wherein said scanning data are relative levels along a line section on a surface of said polishing pad in contact with said semiconductor wafer.

9. The method according to claim 8 further comprising before said step c) a step of ignoring any data point of said relative levels which are beyond a preset range.

10. The method according to claim 9 wherein said condition of said polishing pad is determined to be deteriorated when a maximal difference among said relative levels irrespective of said ignored data point exceeds a preset value.

* * * * *